United States Patent
Tomioka

(10) Patent No.: US 11,972,985 B2
(45) Date of Patent: Apr. 30, 2024

(54) COMPLEMENTARY SWITCH ELEMENT

(71) Applicant: NATIONAL UNIVERSITY CORPORATION HOKKAIDO UNIVERSITY, Hokkaido (JP)

(72) Inventor: Katsuhiro Tomioka, Hokkaido (JP)

(73) Assignee: NATIONAL UNIVERSITY CORPORATION HOKKAIDO UNIVERSITY, Hokkaido (JP)

( * ) Notice: Subject to any disclaimer, the term of this patent is extended or adjusted under 35 U.S.C. 154(b) by 299 days.

(21) Appl. No.: 17/418,104

(22) PCT Filed: Dec. 25, 2019

(86) PCT No.: PCT/JP2019/050823
§ 371 (c)(1),
(2) Date: Jun. 24, 2021

(87) PCT Pub. No.: WO2020/138168
PCT Pub. Date: Jul. 2, 2020

(65) Prior Publication Data
US 2022/0084891 A1 Mar. 17, 2022

(30) Foreign Application Priority Data
Dec. 28, 2018 (JP) .................. 2018-247228

(51) Int. Cl.
*H01L 29/06* (2006.01)
*H01L 21/8234* (2006.01)
(Continued)

(52) U.S. Cl.
CPC ............... *H01L 21/823885* (2013.01); *H01L 21/823412* (2013.01); *H01L 29/0669* (2013.01); *H01L 29/8083* (2013.01); *B82Y 10/00* (2013.01)

(58) Field of Classification Search
CPC ..... H01L 21/823885; H01L 21/823412; H01L 29/0669; H01L 29/8083; H01L 29/7391;
(Continued)

(56) References Cited

U.S. PATENT DOCUMENTS

2012/0187376 A1* 7/2012 Tomioka ........... C23C 16/45525
977/762
2013/0021061 A1 1/2013 Bjoerk
(Continued)

FOREIGN PATENT DOCUMENTS

EP 2472585 A1 7/2012
JP 2011238909 11/2011
(Continued)

OTHER PUBLICATIONS

Search Report from European Application No. 19905615.1 dated Jul. 6, 2022.
(Continued)

*Primary Examiner* — Jae Lee
(74) *Attorney, Agent, or Firm* — Calfee, Halter & Griswold LLP

(57) ABSTRACT

This complementary switch element includes: a first TFET having a first conductive channel; and a second TFET having a second conductive channel. Each of the first TFET and the second TFET includes: a group IV semiconductor substrate doped in a first conductive type; a nanowire which is formed of a group III-V compound semiconductor and is disposed on the group IV semiconductor substrate; a first electrode connected to the group IV semiconductor substrate; a second electrode connected to the nanowire; and a gate electrode. The nanowire includes a first area connected to the group IV semiconductor substrate and a second area doped in a second conductive type. In the first TFET, the second electrode is a source electrode, and the first electrode
(Continued)

is a drain electrode. In the second TFET, the first electrode is a source electrode, and the second electrode is a drain electrode.

6 Claims, 16 Drawing Sheets

(51) Int. Cl.
*H01L 21/8238* (2006.01)
*H01L 29/808* (2006.01)
*B82Y 10/00* (2011.01)

(58) Field of Classification Search
CPC ..... H01L 21/823807; H01L 21/823814; H01L 21/8258; H01L 27/092; H01L 29/0676; H01L 29/068; H01L 29/0684; H01L 29/267; H01L 29/417; H01L 29/66356; H01L 29/20; H01L 29/8122; B82Y 10/00
See application file for complete search history.

(56) References Cited

U.S. PATENT DOCUMENTS

| | | |
|---|---|---|
| 2013/0037823 A1 | 2/2013 | Kanemura |
| 2016/0172246 A1 | 6/2016 | vanDal et al. |
| 2016/0293739 A1 | 10/2016 | Zhang |

FOREIGN PATENT DOCUMENTS

| | | |
|---|---|---|
| JP | 2014525144 | 9/2015 |
| WO | 2011/040012 | 4/2011 |
| WO | 2015/022777 | 2/2015 |
| WO | 2015/064094 | 5/2015 |
| WO | 2017/057329 | 6/2017 |

OTHER PUBLICATIONS

Zhao Qing-Tai et al. "Strained Si and SiGe Nanowire Tunnel FETs for Logic and Analog Applications", IEEE J. of the Electron. Devices Society, vol. 3, No. 3, May 2015, pp. 103-114.
International Search Report and Written Opinion from PCT/JP2019/050823 dated Mar. 17, 2020.
Bhuwalka et al., IEEE Transaction on Electronic Devices, vol. 52, No. 7, Jul. 2005, "A Simulation Approach to Optimize the Electrical Parameters of a Vertical Tunnel FET", 7 pgs.
Bhuwalka et al., IEEE Transaction on Electronic Devices, vol. 52, No. 5, May 2005, "Scaling the Vertical Tunnel FET with Tunnel Bandgap Modulation and Gate Workfunction Engineering", 9 pgs.

\* cited by examiner

COMPLEMENTARY SWITCH ELEMENT

RELATED APPLICATIONS

The present application is a 35 U.S.C. 371 U.S. national stage application entry of PCT International Application No. PCT/JP2019/050823, filed on Dec. 25, 2019, which claims the benefit of Japanese Patent Application No. 2018-247228, filed Dec. 28, 2018, the entire disclosures of which are incorporated herein by reference.

TECHNICAL FIELD

The present invention relates to a complementary switch device.

BACKGROUND ART

Semiconductor microprocessors and highly integrated circuits are manufactured by integrating devices such as metal oxide film semiconductor (hereinafter referred to as "MOS") field-effect transistors (hereinafter referred to as "FET") on semiconductor substrates. In general, complementary MOS-FETs (hereinafter referred to as "CMOS") are the basic devices (switch devices) of integrated circuits. Silicon, a IV group semiconductor, is primarily used as the material for semiconductor substrates. Miniaturizing the transistors that constitute CMOS can improve the integration and performance of semiconductor microprocessors and highly integrated circuits. One of the challenges in miniaturizing CMOS is the increase in power consumption. The two main reasons for the increase in power consumption are the increase in the number of CMOS devices that can be placed on a single microchip and the increase in leakage current due to the short channel effect. Of these, the increase in leakage current leads to an increase in supply voltage. Therefore, it is necessary to suppress the leakage current and reduce the operating voltage of each CMOS.

The sub-threshold (mV/digit) is used as an indicator of the switch characteristics of CMOS. The sub-threshold corresponds to the minimum drive voltage for turning the MOSFET on. The switching characteristics of known MOSFETs are based on the diffusion phenomenon of electrons and holes (carriers). Therefore, the theoretical minimum value of the sub-threshold slope is 60 mV/digit in known MOSFETs, and it is not possible to realize a switch characteristic that shows a smaller sub-threshold than this.

Tunneling FETs (hereinafter referred to as "TFETs") have been reported as switch devices that exceed this physical theoretical limit and operate with a smaller subthreshold (see, for example, NPTLS 1 and 2). TFETs are considered to be a promising candidate for next-generation switch devices because they do not have the short-channel effect and can achieve a high ON/OFF ratio at low voltage.

CITATION LIST

Non-Patent Literature

NPL 1
Bhuwalka, K. K., Schulze, J. and Eisele, I., "Scaling the vertical tunnel FET with tunnel bandgap modulation and gate workfunction engineering", IEEE transactions on electron devices, Vol. 52, No. 5, May (2005), pp. 909-917.
NPL 2
Bhuwalka, K. K., Schulze, J. and Eisele, I., "A simulation approach to optimize the electrical parameters of a vertical tunnel FET", IEEE transactions on electron devices, Vol. 52, No. 7, July (2005), pp. 1541-1547.

SUMMARY OF INVENTION

Technical Problem

When a complementary switch device such as CMOS is configured using a TFET, the TFET must be integrated like a MOSFET. However, TFETs have asymmetrical source and drain regions, so it is not easy to integrate them like MOSFETs, which have symmetrical source and drain regions.

An object of the present invention is to provide a complementary switch device including a TFET that can be easily integrated.

Solution to Problem

A first complementary switch device of an embodiment of the present invention includes: a first tunnel field-effect transistor including a channel of a first conductivity type; and a second tunnel field-effect transistor including a channel of a second conductivity type different from the first conductivity type. Each of the first tunnel field-effect transistor and the second tunnel field-effect transistor includes: a IV group semiconductor substrate including a (111) surface, and doped in the first conductivity type; a III-V group compound semiconductor nanowire disposed on the (111) surface, and including a first region connected to the (111) surface and a second region doped in the second conductivity type; a first electrode connected to the IV group semiconductor substrate; a second electrode connected to the second region; and a gate electrode configured to apply an electric field to an interface between the (111) surface and the first region. In the first tunnel field-effect transistor, the second electrode is a source electrode, and the first electrode is a drain electrode. In the second tunnel field-effect transistor, the first electrode is a source electrode, and the second electrode is a drain electrode.

A second complementary switch device of an embodiment of the present invention includes: a first tunnel field-effect transistor including a channel of a first conductivity type; and a second tunnel field-effect transistor including a channel of a second conductivity type different from the first conductivity type. Each of the first tunnel field-effect transistor and the second tunnel field-effect transistor includes: a IV group semiconductor substrate including a first region including a (111) surface, and a second region doped in the first conductivity type; a III-V group compound semiconductor nanowire disposed on the (111) surface, the III-V group compound semiconductor nanowire being undoped, or doped in the second conductivity type; a first electrode connected to the III-V group compound semiconductor nanowire; a second electrode connected to the second region; and a gate electrode configured to apply an electric field to an interface between the III-V group compound semiconductor nanowire and the (111) surface. In the first tunnel field-effect transistor, the first electrode is a source electrode, and the second electrode is a drain electrode. In the second tunnel field-effect transistor, the second electrode is a source electrode, and the first electrode is a drain electrode.

Advantageous Effects of Invention

According to the present invention, it is possible to provide a complementary switch device including a TFET that can be easily integrated. Therefore, according to the present invention, semiconductor microprocessors and highly integrated circuits with low power consumption can be provided.

DESCRIPTION OF EMBODIMENTS

Embodiments of the present invention are elaborated below with reference to the accompanying drawings.

Embodiment 1

Embodiment 1 describes an example of a complementary switch device according to the embodiment of the present invention in which a III-V group compound semiconductor nanowire vertically extends from a surface of a IV group semiconductor substrate highly doped in the p-type.

Configuration of Complementary Switch Device

Figure 1:
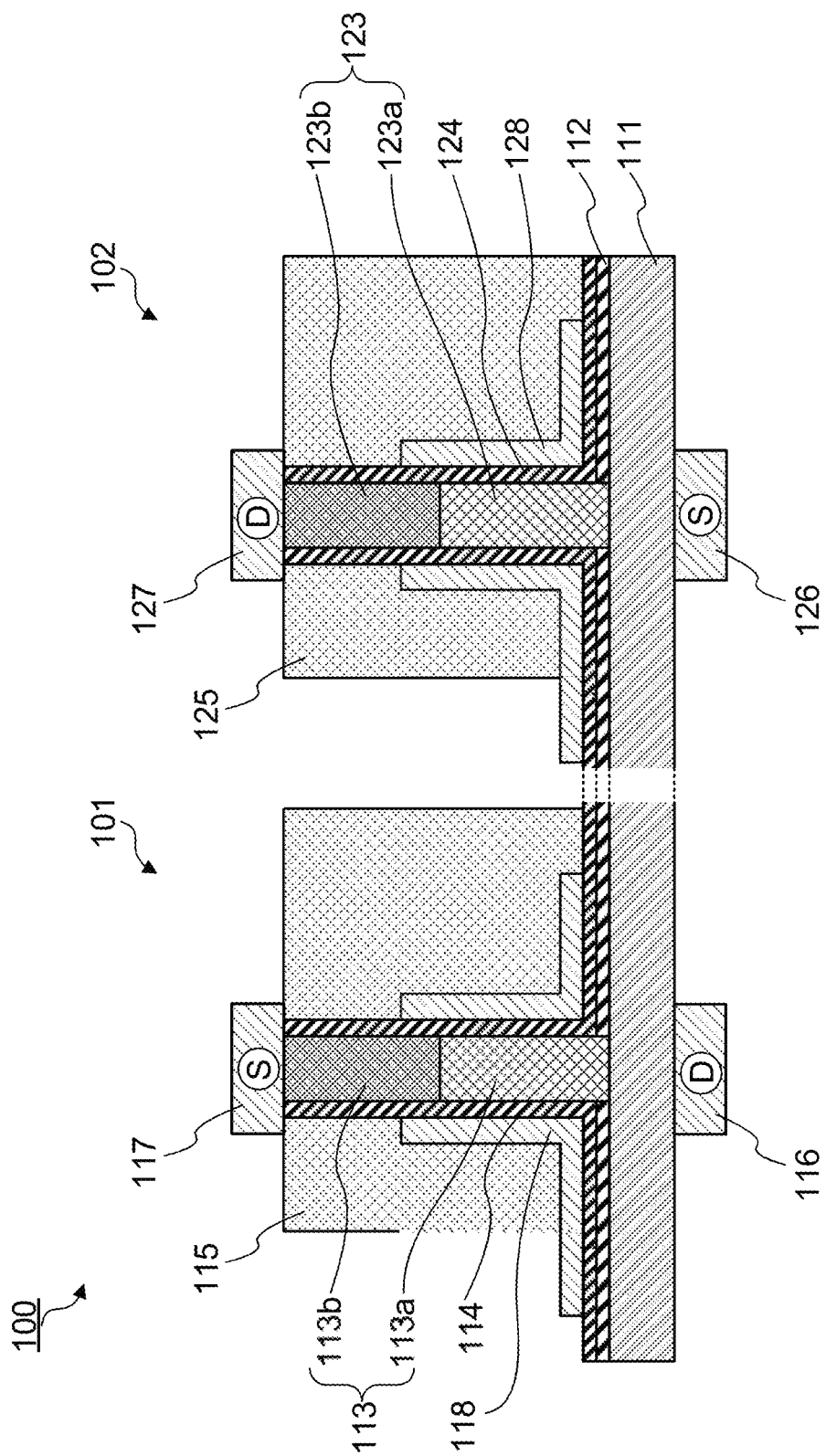
FIG. 1 is a sectional view illustrating a configuration of a complementary switch device according to Embodiment 1.

FIG. 1 is a sectional view illustrating a configuration of complementary switch device 100 according to Embodiment 1. As illustrated in FIG. 1, switch device 100 of Embodiment 1 includes at least one first tunnel field-effect transistor (first TFET) 101 and at least one second tunnel field-effect transistor (second TFET) 102.

First TFET 101 is a TFET (p-TFET) including a p-type channel, and second TFET 102 is a TFET (n-TFET) including an n-type channel. First TFET 101 and second TFET 102 have substantially the same configuration, but the positional relationship between the source electrode (indicated as "S" in FIG. 1) and the drain electrode (indicated as "D" in FIG. 1) is reversed in first TFET 101 and second TFET 102.

First TFET 101 includes IV group semiconductor substrate 111, insulating film 112, III-V group compound semiconductor nanowire 113, gate dielectric film 114, insulation protective film 115, first electrode (drain electrode) 116, second electrode (source electrode) 117 and gate electrode 118. III-V group compound semiconductor nanowire 113 is composed of undoped first region 113a, and second region 113b highly doped in the n-type. In first TFET 101, first electrode 116 is a drain electrode, and second electrode 117 is a source electrode. In first TFET 101, tunneling occurs at the junction interface between the (111) surface of IV group semiconductor substrate 111 and III-V group compound semiconductor nanowire 113.

Second TFET 102 includes IV group semiconductor substrate 111, insulating film 112, III-V group compound semiconductor nanowire 123, gate dielectric film 124, insulation protective film 125, first electrode (source electrode) 126, second electrode (drain electrode) 127 and gate electrode 128. III-V group compound semiconductor nanowire 123 is composed of undoped first region 123a, and second region 123b highly doped in the n-type. In second TFET 102, first electrode 126 is a source electrode, and second electrode 127 is a drain electrode. In second TFET 102, tunneling occurs at the junction interface between the (111) surface of IV group semiconductor substrate 111 and III-V group compound semiconductor nanowire 123.

IV group semiconductor substrate 111 is a substrate composed of IV group semiconductor such as silicon and germanium, and includes a (111) surface as its top surface. IV group semiconductor substrate 111 is, for example, a silicon (111) substrate. In the present embodiment, IV group semiconductor substrate 111 is highly doped in the p-type. The entirety of IV group semiconductor substrate 111 may be doped, or only a part of IV group semiconductor substrate 111 may be doped.

Note that IV group semiconductor substrate 111 that constitutes first TFET 101 and IV group semiconductor substrate 111 that constitutes second TFET 102 are electrically or spatially separated. For example, IV group semiconductor substrate 111 that constitutes first TFET 101 and IV group semiconductor substrate 111 that constitutes second TFET 102 may be electrically separated from each other by disposing a structure with a conduction form different from that of IV group semiconductor substrate 111 between IV group semiconductor substrate 111 that constitutes first TFET 101 and IV group semiconductor substrate 111 that constitutes second TFET 102. In addition, IV group semiconductor substrate 111 that constitutes first TFET 101 and IV group semiconductor substrate 111 that constitutes second TFET 102 may be spatially separated from each other by providing two silicon thin line structures formed on a BOX layer without making contact with each other, as IV group semiconductor substrate 111 that constitutes first TFET 101 and IV group semiconductor substrate 111 that constitutes second TFET 102. Insulating film 112 is an insulating film that covers at least the surface ((111) surface) where III-V group compound semiconductor nanowire 113 and III-V group compound semiconductor nanowire 123 are disposed, of the two surfaces of IV group semiconductor substrate 111. Insulating film 112 may or may not be formed on the other surface (the surface where III-V group compound semiconductor nanowire 113 and III-V group compound semiconductor nanowire 123 are not disposed) of IV group semiconductor substrate 111. In first TFET 101, there is no insulating film 112 between IV group semiconductor substrate 111 and III-V group compound semiconductor nanowire 113, and between IV group semiconductor substrate 111 and first electrode (drain electrode) 116. In second TFET 102, there is no insulating film 112 between IV group semiconductor substrate 111 and III-V group compound semiconductor nanowire 123, and between IV group semiconductor substrate 111 and first electrode (source electrode) 126. Examples of insulating film 112 include a silicon oxide film and a silicon nitride film. For example, insulating film 112 is a silicon oxide film with a film thickness of 20 nm.

III-V group compound semiconductor nanowires 113 and 123 are structures composed of a III-V group compound semiconductor with a diameter of 2 to 100 nm and a length of 50 nm to 10 µm. III-V group compound semiconductor nanowires 113 and 123 are disposed on the (111) surface of IV group semiconductor substrate 111 with their longitudinal axes being perpendicular to the (111) surface. The III-V group compound semiconductor may be any of a semiconductor consisting of two elements, a semiconductor consisting of three elements, a semiconductor consisting of four elements, or a semiconductor consisting of five or more elements. Examples of the III-V group compound semiconductor consisting of two elements include InAs, InP, GaAs, GaN, InSb, GaSb and AlSb. Examples of the III-V group compound semiconductor consisting of three elements include AlGaAs, InGaAs, InGaN, AlGaN, GaNAs, InAsSb, GaAsSb, InGaSb and AlInSb. Examples of the III-V group compound semiconductor consisting of four or more elements include InGaAlN, AlInGaP, InGaAsP, GaInAsN, InGaAlSb, InGaAsSb and AlInGaPSb.

As described above, III-V group compound semiconductor nanowires 113 and 123 are composed of undoped first regions 113a and 123a (intrinsic semiconductor) and second regions 113b and 123b highly doped in the n-type (n-type semiconductor). First regions 113a and 123a are connected to the (111) surface of IV group semiconductor substrate 111. Second regions 113b and 123b are connected to second electrodes 117 and 127. First regions 113a and 123a of III-V group compound semiconductor nanowires 113 and 123 and the (111) surface of IV group semiconductor substrate 111 form a substantially dislocation-free and defect-free junction interface.

Gate dielectric films 114 and 124 are insulating films that cover at least a part of the side surfaces of III-V group compound semiconductor nanowires 113 and 123. In the present embodiment, gate dielectric films 114 and 124 cover the entire side surfaces of III-V group compound semiconductor nanowires 113 and 123, and one surface of IV group semiconductor substrate 111 (more specifically, insulating film 112). Gate dielectric films 114 and 124 are, for example, high dielectric films such as hafnium aluminate ($HfAlO_x$) films.

Insulation protective films 115 and 125 are films composed of an insulating resin that cover III-V group compound semiconductor nanowires 113 and 123, gate dielectric films 114 and 124 and gate electrodes 118 and 128. The type of the insulation resin is, but not limited to, a BCB resin, for example.

First electrodes 116 and 126 are disposed on IV group semiconductor substrate 111, and are connected to IV group semiconductor substrate 111 (p-type semiconductor). First electrodes 116 and 126 are, for example, Ti/Au alloy films. Of the two surfaces of IV group semiconductor substrate 111, first electrodes 116 and 126 may be disposed on the surface where III-V group compound semiconductor nanowires 113 and 123 are disposed, or the other surface of IV group semiconductor substrate 111 (the surface where III-V group compound semiconductor nanowires 113 and 123 are not disposed). In first TFET 101, first electrode 116 functions as a drain electrode. In second TFET 102, first electrode 126 functions as a source electrode.

Second electrodes 117 and 127 are disposed on III-V group compound semiconductor nanowires 113 and 123 and insulation protective films 115 and 125, and connected to second regions 113b and 123b (n-type semiconductor) of III-V group compound semiconductor nanowires 113 and 123. Second electrodes 117 and 127 are, for example, Ti/Au alloy films or Ge/Au/Ni/Au alloy films. In first TFET 101, second electrode 117 functions as a source electrode. In second TFET 102, second electrode 127 functions as a drain electrode.

Gate electrodes 118 and 128 are disposed so as to be able to apply an electric field to the junction interface between IV group semiconductor substrate 111 and first regions 113a and 123a of III-V group compound semiconductor nanowires 113 and 123. In the present embodiment, gate electrodes 118 and 128 are disposed on gate dielectric films 114 and 124 so as to cover the periphery of first regions 113a and 123a of III-V group compound semiconductor nanowires 113 and 123. Gate electrodes 118 and 128 are, for example, Ti/Au alloy films.

Figure 2:
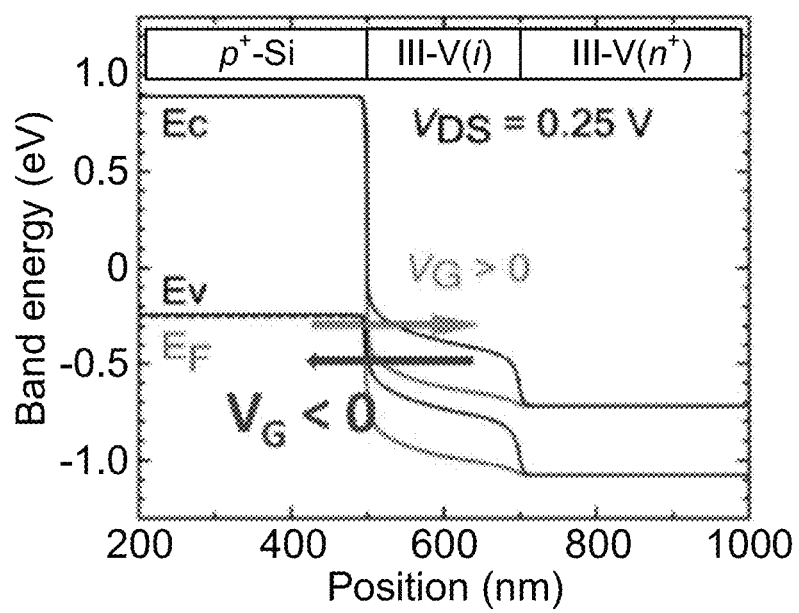
FIG. 2 is a band structure diagram of a first TFET and a second TFET of the complementary switch device according to Embodiment 1.
Figure 3:
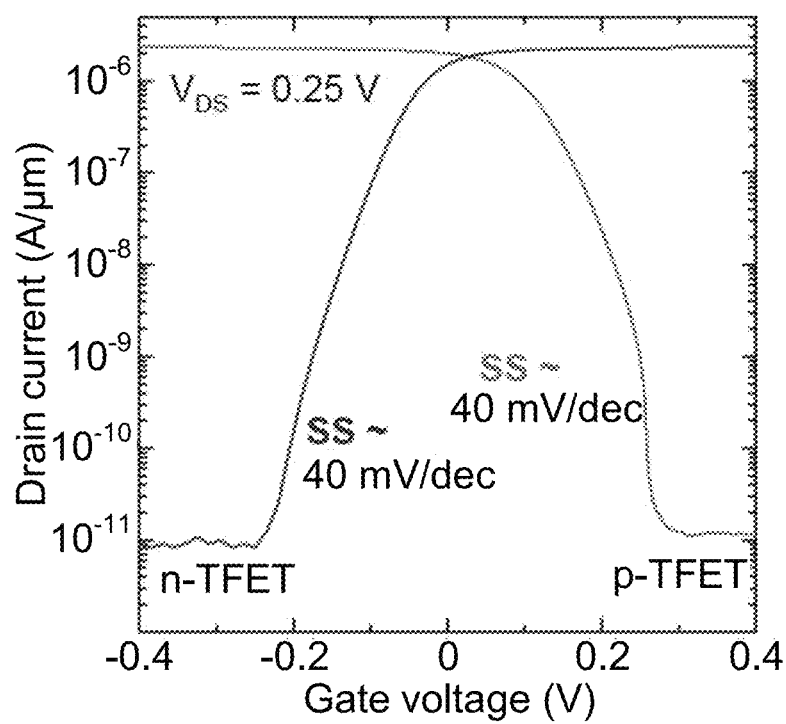
FIG. 3 is a graph illustrating electrical characteristics of the first TFET (p-TFET) and the second TFET (n-TFET)

In first TFET 101 and second TFET 102, the junction interface between the (111) surface of IV group semiconductor substrate 111 and first regions 113a and 123a of III-V group compound semiconductor nanowires 113 and 123 functions as a tunnel layer. As described above, first TFET 101 and second TFET 102 have substantially the same configuration, but the positional relationship between the source electrode (indicated as "S" in FIG. 1) and the drain electrode (indicated as "D" in FIG. 1) is reversed in first TFET 101 and second TFET 102. The present inventor found that first TFET 101 operates as a TFET (p-TFET) including a p-type channel and second TFET 102 operates as a TFET (n-TFET) including an n-type channel by only changing the position of the electrode in the above-described manner, as illustrated in FIG. 2. FIG. 3 is a graph illustrating electrical characteristics of first TFET 101 (p-TFET) and second TFET 102 (n-TFET). As shown in the graph, each of the sub threshold values of first TFET 101 and second TFET 102 is 40 mV/digit or smaller.

Figure 4A:
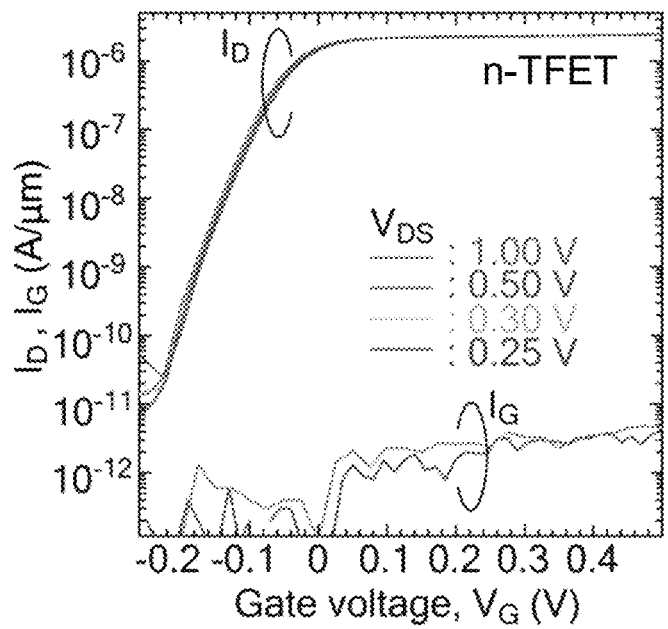
FIG. 4A is a graph illustrating electrical characteristics of the second TFET (n-TFET)
Figure 4B:
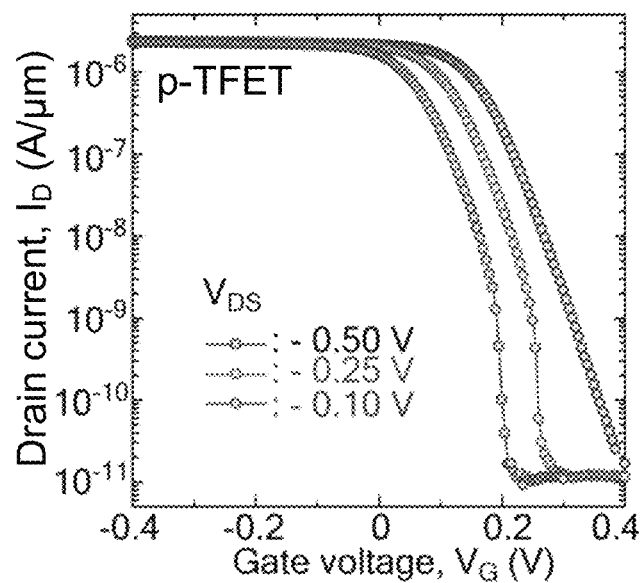
FIG. 4B is a graph illustrating electrical characteristics of the first TFET (p-TFET)
Figure 5A:
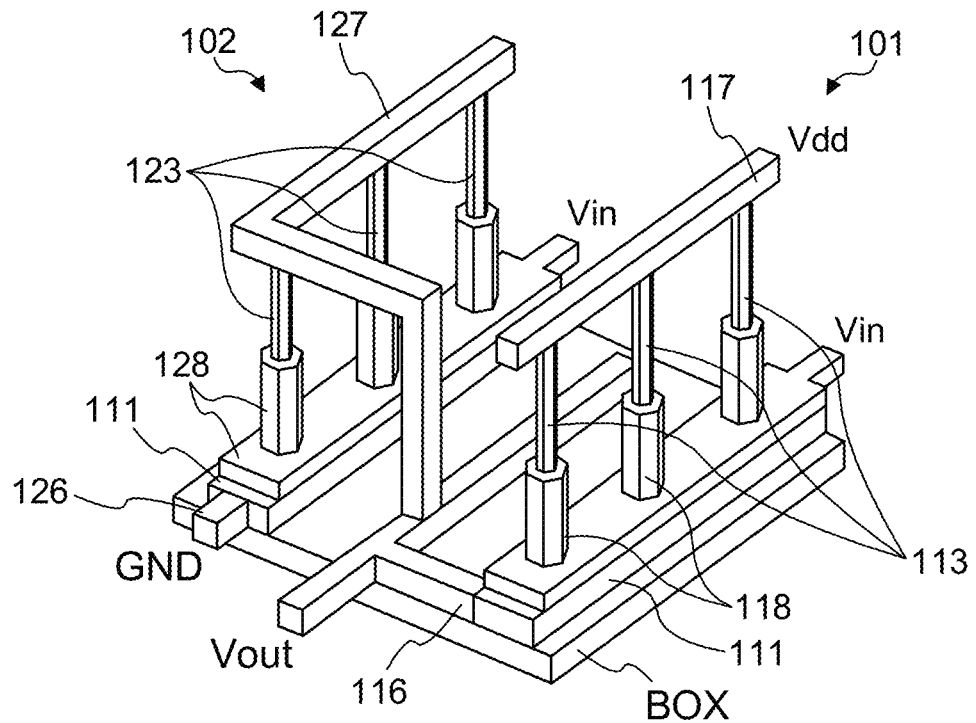
FIG. 5A is a perspective view illustrating an example of an inverter configured using the complementary switch device according to Embodiment 1.
Figure 5B:
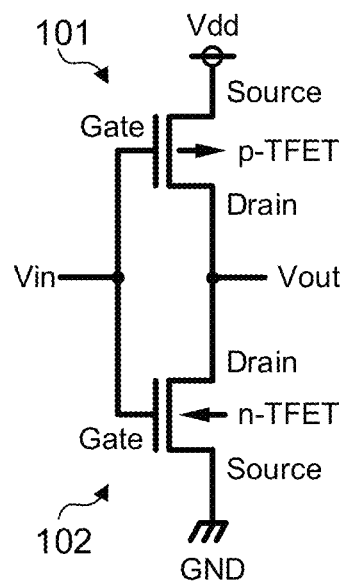
FIG. 5B is a circuit diagram of the inverter illustrated in FIG. 5A.

FIG. 4A is a graph illustrating a relationship between gate voltage $V_G$ and drain current ID or gate current $I_G$ for each drain electrode potential VDS with respect to the source electrode in second TFET 102 (n-TFET) at room temperature. FIG. 4B is a graph illustrating a relationship between gate voltage $V_G$ and drain current ID for each drain electrode potential VDS with respect to the source electrode in first TFET 101 (p-TFET) at room temperature. It can be seen from these graphs that even when drain electrode potential VDS with respect to the source electrode is changed, the sub threshold values of first TFET 101 and second TFET 102 are: a minimum of 21 mV/digit and an average of 40 mV/digit or smaller in second TFET 102, and a minimum of 6 mV/digit and an average of 40 mV/digit in first TFET 101. It can also be seen that a complementary switching operation can be achieved with the same structure by exchanging the source electrode and the drain electrode. In switch device 100 according to the present embodiment, the functions as various types of complementary switch devices can be achieved by appropriately connecting one or more first TFETs 101 and one or more second TFETs 102. FIG. 5A is a perspective view illustrating an example of an inverter configured using complementary switch device 100, and FIG. 5B is a circuit diagram of the inverter illustrated in FIG. 5A. In FIG. 5A, an example in which complementary switch device 100 is formed on a BOX layer is illustrated, and insulating film 112, gate dielectric films 114 and 124, and insulation protective films 115 and 125 are omitted. In FIG. 5A, two silicon thin line structures formed on a BOX layer without making contact with each other are IV group semiconductor substrate 111 that constitutes first TFET 101 and IV group semiconductor substrate 111 that constitutes second TFET 102.

Method of Manufacturing Complementary Switch Device

The method of manufacturing switch device 100 according to the present embodiment is not limited. First TFET 101 and second TFET 102 may be manufactured by the method disclosed in WO2011/040012, for example.

FIGS. 6A to 6D are schematic views illustrating an exemplary method of manufacturing switch device 100. First TFET 101 and second TFET 102 are simultaneously produced through the same procedure, and therefore FIGS. 6A to 6D illustrate only first TFET 101. The method of manufacturing switch device 100 is described with reference to FIGS. 6A to 6D.

Figure 6A:
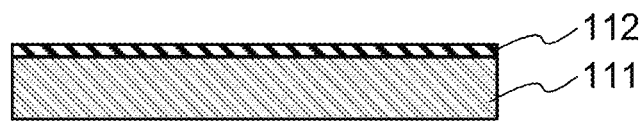
FIGS. 6A to 6D are schematic views illustrating an exemplary method of manufacturing the complementary switch device according to Embodiment 1.
Figure 6B:
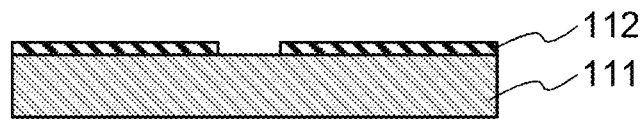
Figure 6C:
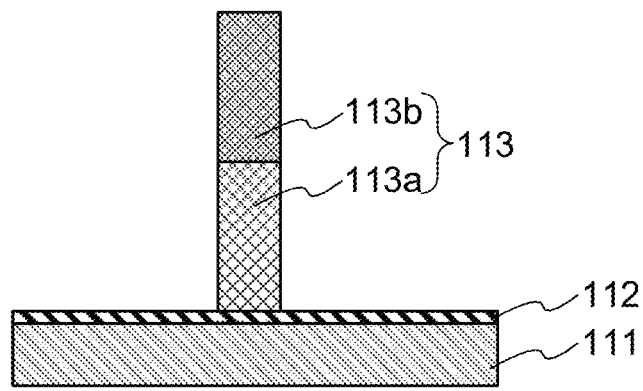
Figure 6D:
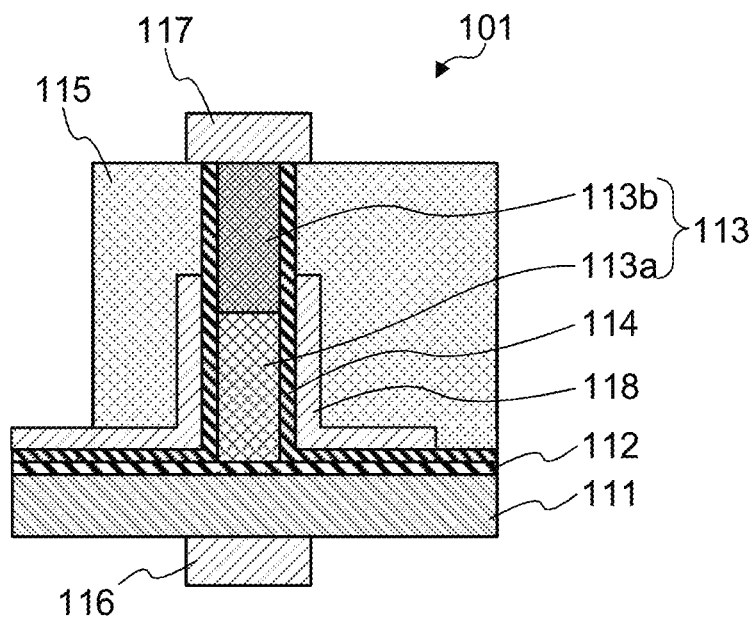

First, as illustrated in FIG. 6A, IV group semiconductor substrate 111 highly doped in the p-type is prepared. On IV group semiconductor substrate 111 (111surface), insulating film 112 is formed by the heat oxidation method and the like. Next, as illustrated in FIG. 6B, an opening with a predetermined size (e.g., a diameter of 20 nm) is formed by a photolithography method and the like in insulating film 112 on IV group semiconductor substrate 111. Next, as illustrated in FIG. 6C, by a MOVPE method, III-V group compound semiconductor nanowire 113 is grown from the (111) surface of IV group semiconductor substrate 111 exposed through the opening. At this time, before III-V group compound semiconductor nanowire 113 is grown, it is preferable to form a thin film of III-V group compound semiconductor at the (111) surface of IV group semiconductor substrate 111 by an alternate raw material supply modulation method (see WO2011/040012). In addition, immediately after III-V group compound semiconductor nanowire 113 is formed, undoped first region 113*a*, and second region 113*b* highly doped in the n-type are formed by doping second region 113*b* of III-V group compound semiconductor nanowire 113. Finally, as illustrated in FIG. 6D, gate dielectric film 114, insulation protective film 115, first electrode 116, second electrode 117 and gate electrode 118 are formed.

Effect

In switch device 100 according to the present embodiment, first TFET 101 (p-TFET) and second TFET 102 (n-TFET) have substantially the same configuration. Thus, switch device 100 according to the present embodiment can be easily integrated even though it is a complementary switch device including a TFET.

Embodiment 2

Embodiment 2 describes an example of a complementary switch device according to the embodiment of the present invention in which a III-V group compound semiconductor nanowire vertically extends from a surface of IV group semiconductor substrate highly doped in the n-type.

Configuration of Complementary Switch Device

Figure 7:
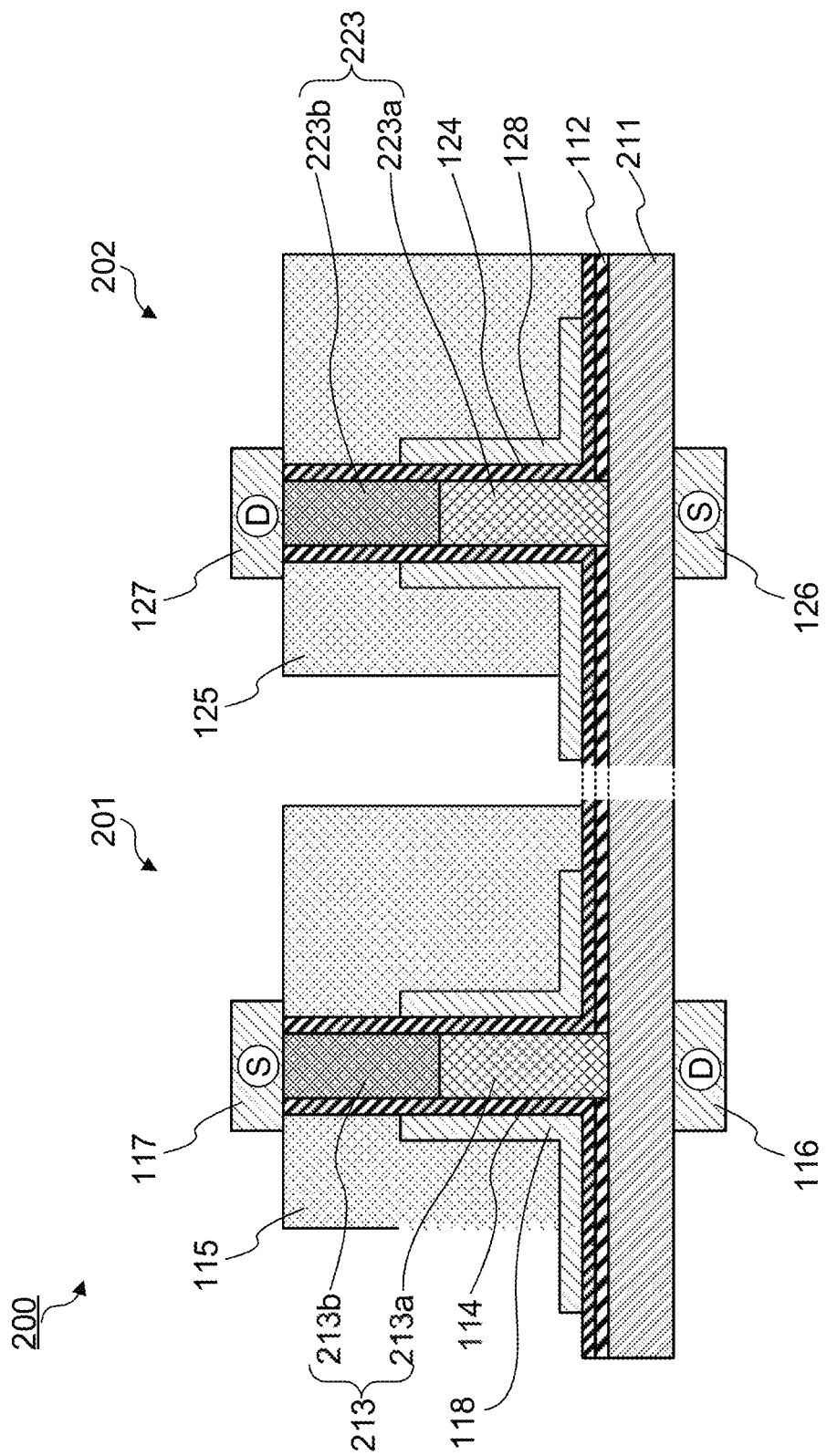
FIG. 7 is a sectional view illustrating a configuration of a complementary switch device according to Embodiment 2.

FIG. 7 is a sectional view illustrating a configuration of complementary switch device 200 according to Embodiment 2. The same components as those of the TFET of Embodiment 1 are denoted with the same reference numerals, and overlapping descriptions are omitted. As illustrated in FIG. 7, switch device 200 of Embodiment 2 includes at least one first tunnel field-effect transistor (first TFET) 201 and at least one second tunnel field-effect transistor (second TFET) 202.

First TFET 201 is a TFET (n-TFET) including an n-type channel, and second TFET 202 is a TFET (p-TFET) including a p-type channel. First TFET 201 and second TFET 202 have substantially the same configuration, but the positional relationship between the source electrode (indicated as "S" in FIG. 7) and the drain electrode (indicated as "D" in FIG. 7) is reversed in first TFET 201 and second TFET 202.

First TFET 201 includes IV group semiconductor substrate 211, insulating film 112, III-V group compound semiconductor nanowire 213, gate dielectric film 114, insulation protective film 115, first electrode (drain electrode) 116, second electrode (source electrode) 117 and gate electrode 118. III-V group compound semiconductor nanowire 213 is composed of undoped first region 213*a*, and second region 213*b* highly doped in the p-type. In first TFET 201, first electrode 116 is a drain electrode, and second electrode 117 is a source electrode. In first TFET 201, tunneling occurs at the junction interface between the (111) surface of IV group semiconductor substrate 211 and III-V group compound semiconductor nanowire 213.

Second TFET 202 includes IV group semiconductor substrate 211, insulating film 112, III-V group compound semiconductor nanowire 223, gate dielectric film 124, insulation protective film 125, first electrode (source electrode) 126, second electrode (drain electrode) 127 and gate electrode 128. III-V group compound semiconductor nanowire 223 is composed of undoped first region 223*a*, and second region 223*b* highly doped in the p-type. In second TFET 202, first electrode 126 is a source electrode, and second electrode 127 is a drain electrode. In second TFET 202, tunneling occurs at the junction interface between the (111) surface of IV group semiconductor substrate 211 and III-V group compound semiconductor nanowire 223.

IV group semiconductor substrate 211 is a substrate composed of IV group semiconductor such as silicon and germanium, and includes a (111) surface as its top surface. IV group semiconductor substrate 211 is, for example, a silicon (111) substrate. In the present embodiment, IV group semiconductor substrate 211 is highly doped in the n-type. The entirety of IV group semiconductor substrate 211 may be doped, or only a part of IV group semiconductor substrate 211 may be doped.

Note that IV group semiconductor substrate 211 that constitutes first TFET 201 and IV group semiconductor substrate 211 that constitutes second TFET 202 are electrically or spatially separated. For example, IV group semiconductor substrate 211 that constitutes first TFET 201 and IV group semiconductor substrate 211 that constitutes second TFET 202 may be electrically separated from each other by disposing a structure with a conduction form different from that of IV group semiconductor substrate 211 between IV group semiconductor substrate 211 that constitutes first TFET 201 and IV group semiconductor substrate 211 that constitutes second TFET 202. In addition, IV group semiconductor substrate 211 that constitutes first TFET 201 and IV group semiconductor substrate 211 that constitutes second TFET 202 may be spatially separated from each other by providing two silicon thin line structures formed on a BOX layer without making contact with each other, as IV group semiconductor substrate 211 that constitutes first TFET 201 and IV group semiconductor substrate 211 that constitutes second TFET 202. III-V group compound semiconductor nanowires 213 and 223 are structures composed of a III-V group compound semiconductor with a diameter of 2 to 100 nm and a length of 50 nm to 10 μm. III-V group compound semiconductor nanowires 213 and 223 are disposed on the (111) surface of IV group semiconductor substrate 211 with their longitudinal axes being perpendicular to the (111) surface. The III-V group compound semiconductor may be any of a semiconductor consisting of two elements, a semiconductor consisting of three elements, a semiconductor consisting of four elements, or a semiconductor consisting of five or more elements.

III-V group compound semiconductor nanowires 213 and 223 are composed of undoped first regions 213a and 223a (intrinsic semiconductor), and second regions 213b and 223b highly doped in the p-type (p-type semiconductor). First regions 213a and 223a are connected to the (111) surface of IV group semiconductor substrate 211. Second regions 213b and 223b are connected to second electrodes 117 and 127. First regions 213a and 223a of III-V group compound semiconductor nanowires 213 and 223 and the (111) surface of IV group semiconductor substrate 211 form a substantially dislocation-free and defect-free junction interface.

Figure 8:
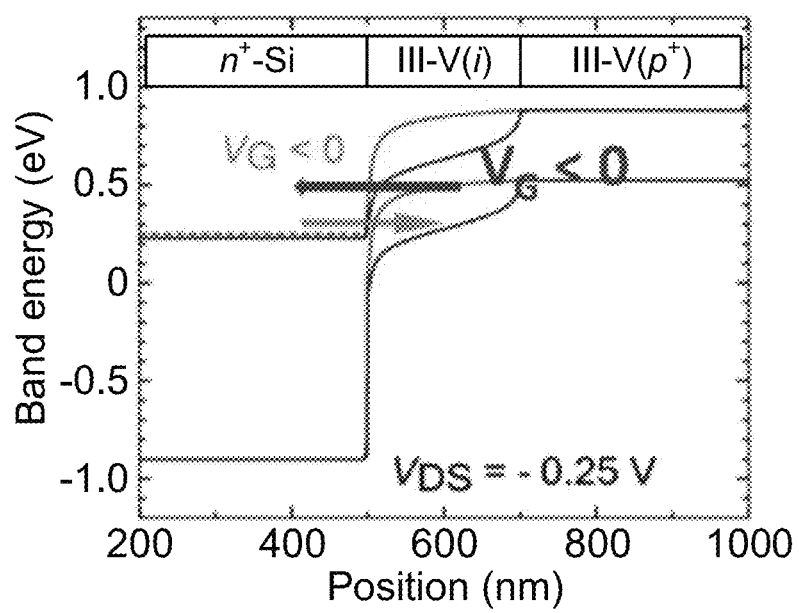
FIG. 8 is a band structure diagram of a first TFET and a second TFET of the complementary switch device according to Embodiment 2.

In first TFET 201 and second TFET 202, the junction interface between the (111) surface of IV group semiconductor substrate 211 and first regions 213a and 223a of III-V group compound semiconductor nanowires 213 and 223 functions as a tunnel layer. As described above, first TFET 201 and second TFET 202 have substantially the same configuration, but the positional relationship between the source electrode (indicated as "S" in FIG. 7) and the drain electrode (indicated as "D" in FIG. 7) is reversed in first TFET 201 and second TFET 202. The present inventor found that by only changing the position of the electrode in the above-described manner, first TFET 201 operates as a TFET (n-TFET) including an n-type channel, and second TFET 202 operates as a TFET (p-TFET) including a p-type channel as illustrated in FIG. 8. Thus, the functions as various types of complementary switch devices can be achieved by appropriately connecting one or more first TFETs 201 and one or more second TFETs 202.

Method of Manufacturing Complementary Switch Device

The method of manufacturing switch device 200 according to the present embodiment is not limited. Switch device 200 of Embodiment 2 can be manufactured through the same procedure as that of switch device 100 of Embodiment 1.

Effect

In switch device 200 according to the present embodiment, first TFET 201 (n-TFET) and second TFET 202 (p-TFET) have substantially the same configuration. Thus, switch device 200 according to the present embodiment can be easily integrated even though it is a complementary switch device including a TFET.

Embodiment 3

Embodiment 3 describes an example of a complementary switch device according to the embodiment of the present invention in which a III-V group compound semiconductor nanowire obliquely extends from a surface of a IV group semiconductor substrate low-doped in the p-type.

Configuration of Complementary Switch Device

Figure 9:
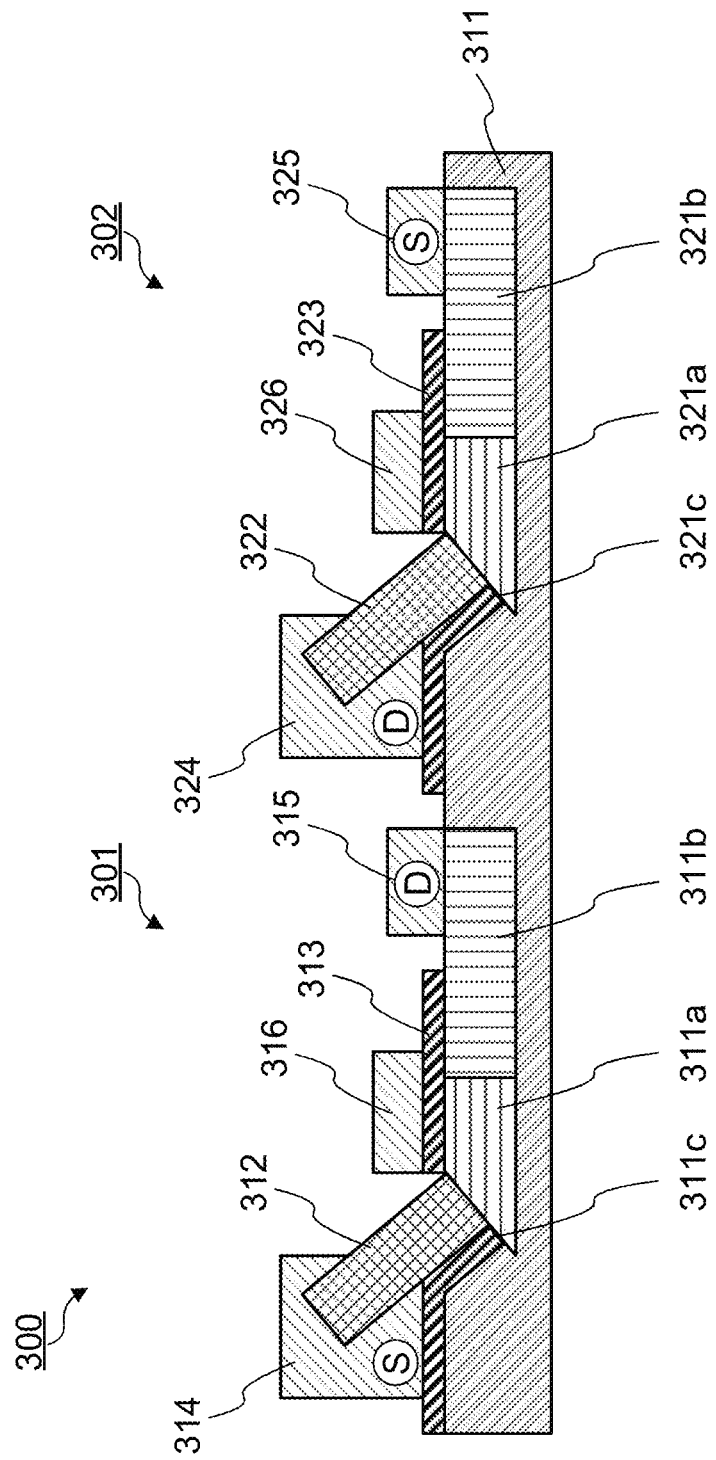
FIG. 9 is a sectional view illustrating a configuration of a complementary switch device according to Embodiment 3.

FIG. 9 is a sectional view illustrating a configuration of complementary switch device 300 according to Embodiment 3. As illustrated in FIG. 9, switch device 300 of Embodiment 3 includes at least one first tunnel field-effect transistor (first TFET) 301 and at least one second tunnel field-effect transistor (second TFET) 302.

First TFET 301 is a TFET (n-TFET) including an n-type channel, and second TFET 302 is a TFET (p-TFET) including a p-type channel. First TFET 301 and second TFET 302 have substantially the same configuration, but the positional relationship between the source electrode (indicated as "S" in FIG. 9) and the drain electrode (indicated as "D" in FIG. 9) is reversed in first TFET 301 and second TFET 302.

First TFET 301 includes IV group semiconductor substrate 311, III-V group compound semiconductor nanowire 312, insulating film (gate dielectric film) 313, first electrode (source electrode) 314, second electrode (drain electrode) 315 and gate electrode 316. A partial region of insulating film 313 functions also as a gate dielectric film. IV group semiconductor substrate 311 is composed of undoped first region 311a, and second region 311b highly doped in the n-type. In first TFET 301, first electrode 314 is a source electrode, and second electrode 315 is a drain electrode. In first TFET 301, tunneling occurs at the junction interface between (111) surface 311c of IV group semiconductor substrate 311 and III-V group compound semiconductor nanowire 312.

Second TFET 302 includes IV group semiconductor substrate 311, III-V group compound semiconductor nanowire 322, insulating film (gate dielectric film) 323, first electrode (drain electrode) 324, second electrode (source electrode) 325 and gate electrode 326. A partial region of insulating film 323 functions also as a gate dielectric film. IV group semiconductor substrate 311 includes undoped first region 321a, and second region 321b highly doped in the n-type. In second TFET 302, first electrode 324 is a drain electrode, and second electrode 325 is a source electrode. In second TFET 302, tunneling occurs at the junction interface between (111) surface 321c of IV group semiconductor substrate 311 and III-V group compound semiconductor nanowire 322.

IV group semiconductor substrate 311 is a substrate composed of a IV group semiconductor such as silicon and germanium, and includes a (100) surface as its top surface. IV group semiconductor substrate 311 is, for example, a silicon (100) substrate. In the present embodiment, IV group semiconductor substrate 311 is low-doped in the p-type. In first TFET 301, undoped first region 311a (intrinsic semiconductor) and second region 311b highly doped in the n-type (n-type semiconductor) are formed adjacent to each other at the surface where III-V group compound semiconductor nanowire 312 is disposed, of the two surfaces of IV group semiconductor substrate 311. First region 311a includes not only the (100) surface, but also (111) surface 311c. Likewise, also in second TFET 302, undoped first region 321a (intrinsic semiconductor), and second region 321b highly doped in the n-type (n-type semiconductor) are formed adjacent to each other at the surface where III-V group compound semiconductor nanowire 322 is disposed, of the two surfaces of IV group semiconductor substrate 311. First region 321a includes not only the (100) surface, but also (111) surface 321c.

III-V group compound semiconductor nanowires 312 and 322 are structures composed of a III-V group compound semiconductor with a diameter of 2 to 100 nm and a length of 50 nm to 10 μm. III-V group compound semiconductor nanowires 312 and 322 are disposed on (111) surfaces 311c and 321c of IV group semiconductor substrate 311 with their longitudinal axes being perpendicular to (111) surfaces 311c and 321c. The III-V group compound semiconductor may be any of a semiconductor consisting of two elements, a semiconductor consisting of three elements, a semiconductor consisting of four elements, or a semiconductor consisting of five or more elements. Examples of the III-V group compound semiconductor consisting of two elements include InAs, InP, GaAs, GaN, InSb, GaSb and AlSb. Examples of the III-V group compound semiconductor consisting of three elements include AlGaAs, InGaAs, InGaN, AlGaN, GaNAs, InAsSb, GaAsSb, InGaSb and AlInSb. Examples of the III-V group compound semiconductor consisting of four or more elements include InGaAlN, AlInGaP, InGaAsP, GaInAsN, InGaAlSb, InGaAsSb and AlInGaPSb.

III-V group compound semiconductor nanowires 312 and 322 are undoped, or low-doped in the p-type. In the present embodiment, III-V group compound semiconductor nanowires 312 and 322 are low-doped in the p-type. III-V group compound semiconductor nanowires 312 and 322 and (111) surfaces 311c and 321c of IV group semiconductor substrate 311 form a substantially dislocation-free and defect-free junction interface.

Insulating films 313 and 323 are insulating films that cover at least all of the surface ((100) surface) of first regions 311a and 321a of IV group semiconductor substrate 311 and a part of the surface ((100) surface) of second regions 311b and 321b. As described above, a partial region of insulating films 313 and 323 functions as a gate dielectric film. In the present embodiment, insulating films 313 and 323 cover all of the surface of first regions 311a and 321a, a part of the surface of second regions 311b and 321b, and portions below first electrodes 314 and 324 of IV group semiconductor substrate 311. Insulating films 313 and 323 are, for example, high dielectric films such as hafnium aluminate (HfAlO$_x$) films.

First electrodes 314 and 324 are disposed on IV group semiconductor substrate 311 with insulating films 313 and 323 therebetween, and are connected to III-V group compound semiconductor nanowires 312 and 322 (p-type semiconductor). First electrodes 314 and 324 are, for example, Ti/Au alloy films. In first TFET 301, first electrode 314 functions as a source electrode. In second TFET 302, first electrode 324 functions as a drain electrode.

Second electrodes 315 and 325 are disposed on second regions 311b and 321b of IV group semiconductor substrate 311, and are connected to second regions 311b and 321b (n-type semiconductor). Second electrodes 315 and 325 are, for example, Ti/Au alloy films or Ge/Au/Ni/Au alloy films. In first TFET 301, second electrode 315 functions as a drain electrode. In second TFET 302, second electrode 325 functions as a source electrode. Gate electrodes 316 and 326 are disposed so as to be able to apply an electric field to the junction interface between first regions 311a and 321a of IV group semiconductor substrate 311 and III-V group compound semiconductor nanowires 312 and 322. In the present embodiment, gate electrodes 316 and 326 are disposed on insulating films (gate dielectric films) 313 and 323 on first regions 311a and 321a. Gate electrodes 316 and 326 are, for example, Ti/Au alloy films.

Figure 10:
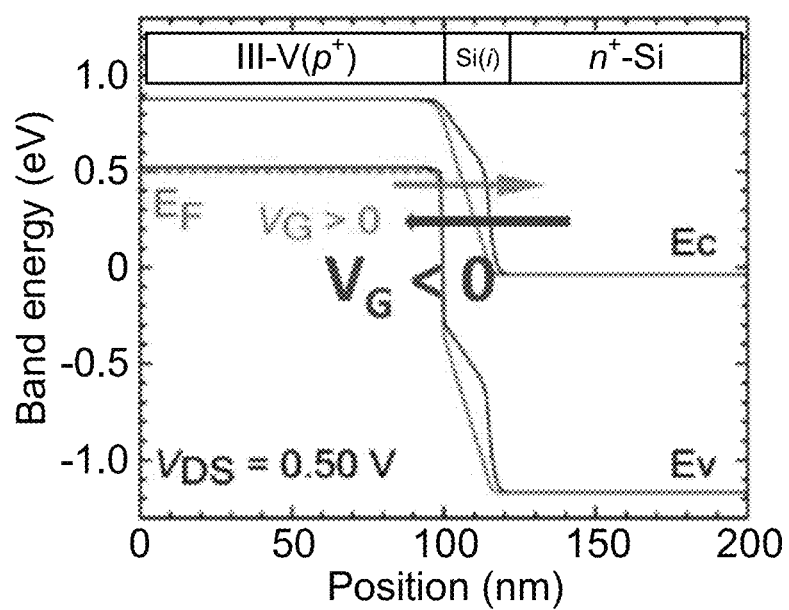
FIG. 10 is a band structure diagram of a first TFET and a second TFET of the complementary switch device according to Embodiment 3.
Figure 11:
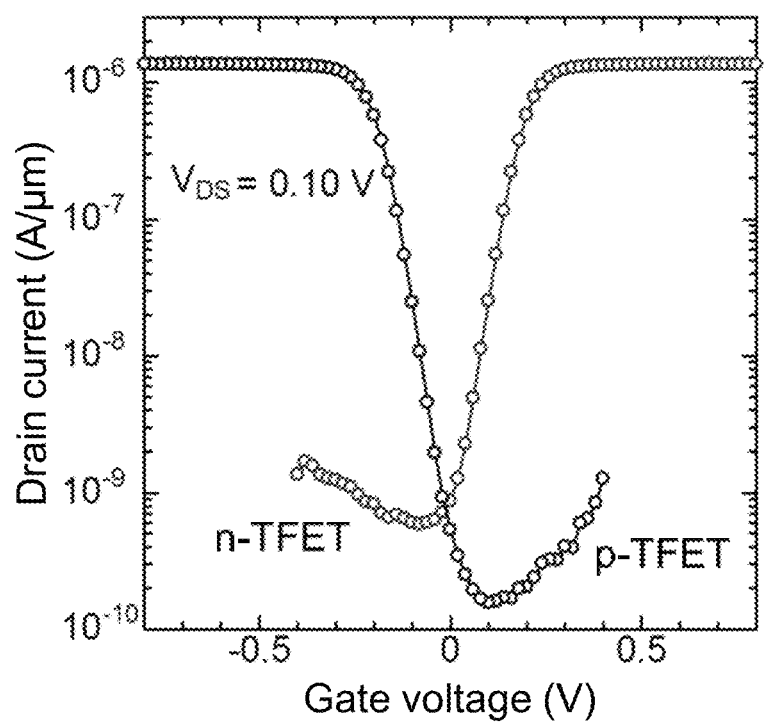
FIG. 11 is a graph illustrating electrical characteristics of the first TFET (n-TFET) and the second TFET (p-TFET)

In first TFET 301 and second TFET 302, the junction interface between (111) surfaces 311c and 321c of IV group semiconductor substrate 311 and III-V group compound semiconductor nanowires 312 and 322 functions as a tunnel layer. As described above, first TFET 301 and second TFET 302 have substantially the same configuration, but the positional relationship between the source electrode (indicated as "S" in FIG. 9) and the drain electrode (indicated as "D" in FIG. 9) is reversed in first TFET 301 and second TFET 302. The present inventor found that by only changing the position of the electrode in the above-described manner, first TFET 301 operates as a TFET (n-TFET) including an n-type channel, and second TFET 302 operates as a TFET (p-TFET) including a p-type channel as illustrated in FIG. 10. FIG. 11 is a graph illustrating electrical characteristics of first TFET 301 (n-TFET) and second TFET 302 (p-TFET). As shown in the graph, the sub threshold value of each of first TFET 301 and second TFET 302 is a minimum of 50 mV/digit.

Figure 12A:
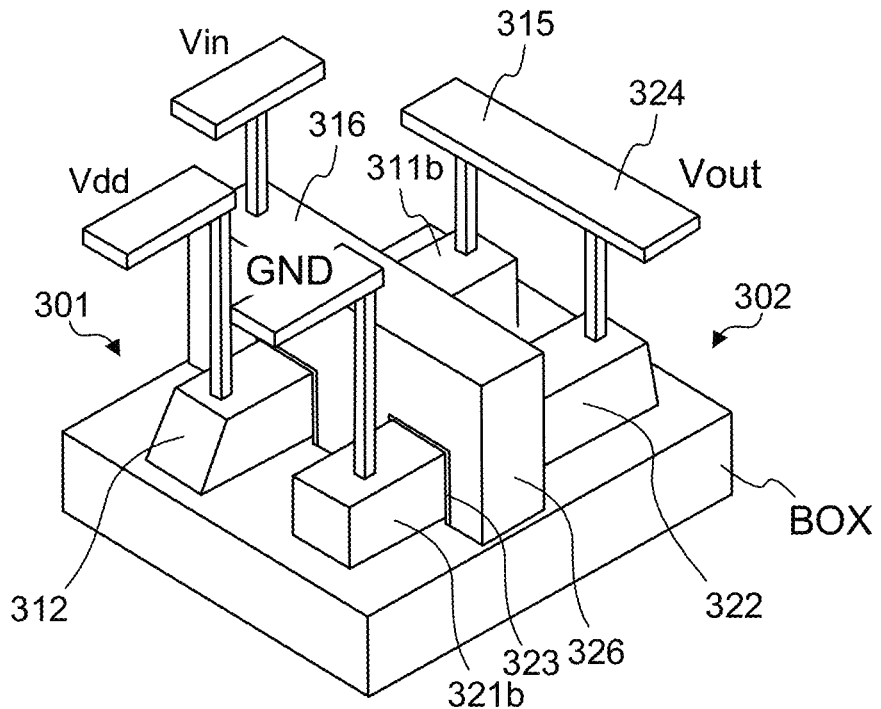
FIG. 12A is a perspective view illustrating an example of an inverter configured using the complementary switch device according to Embodiment 3.
Figure 12B:
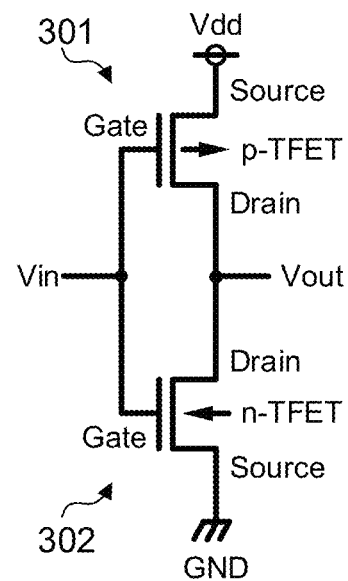
FIG. 12B is a circuit diagram of the inverter illustrated in FIG. 12A.
Figure 13:
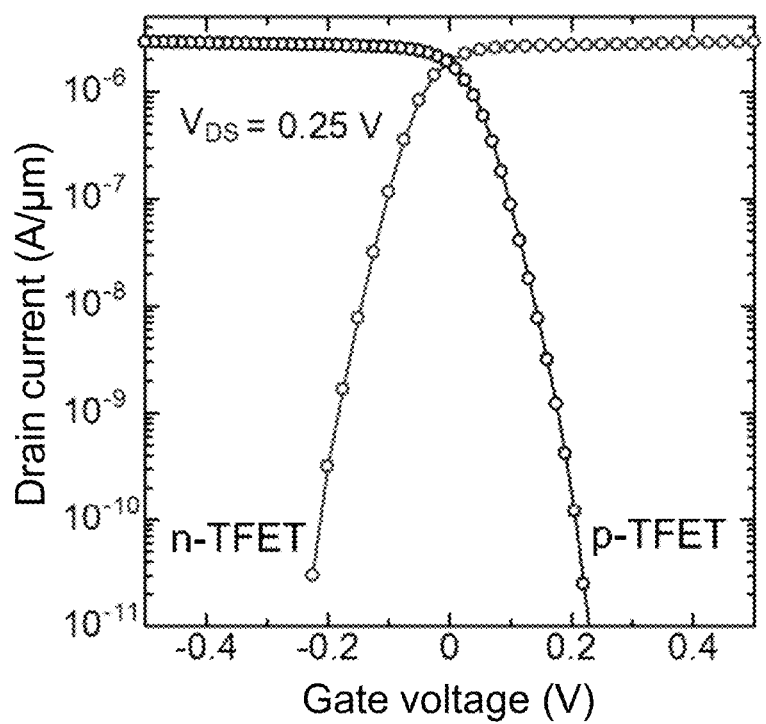
FIG. 13 is a graph illustrating electrical characteristics of a fin-type first TFET (n-TFET) and a fin-type second TFET (p-TFET)

In switch device 300 according to the present embodiment, the functions as various types of complementary switch devices can be achieved by appropriately connecting one or more first TFETs 301 and one or more second TFETs 302. FIG. 12A is a perspective view illustrating an example of an inverter configured using complementary switch device 300, and FIG. 12B is a circuit diagram of the inverter illustrated in FIG. 12A. FIG. 12A illustrates an example in which complementary switch device 300 is formed by forming fin-type first TFET 301 and fin-type second TFET 302 on a BOX layer, and a part of IV group semiconductor substrate 311 is omitted. FIG. 13 is a graph illustrating electrical characteristics of fin-type first TFET 301 (n-TFET) and fin-type second TFET 302 (p-TFET). As shown in the graph, the sub threshold value of each of first TFET 301 and second TFET 302 is 40 mV/digit or smaller.

Method of Manufacturing Complementary Switch Device

The method of manufacturing switch device 300 according to the present embodiment is not limited. First TFET 301 and second TFET 302 are manufactured by the method disclosed in WO2011/040012, for example.

FIGS. 14A to 14D are schematic views illustrating an exemplary method of manufacturing switch device 300. First TFET 301 and second TFET 302 are simultaneously produced through the same procedure, and therefore FIGS. 14A to 14D illustrate only first TFET 301. The method of manufacturing switch device 300 is described below with reference to FIG. 14A to FIG. 14D.

Figure 14A:
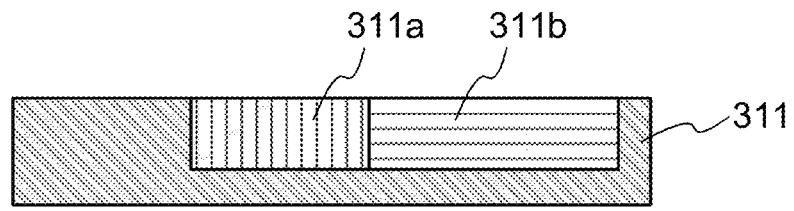
FIGS. 14A to 14D are schematic views illustrating an exemplary method of manufacturing the complementary switch device according to Embodiment 3.
Figure 14B:
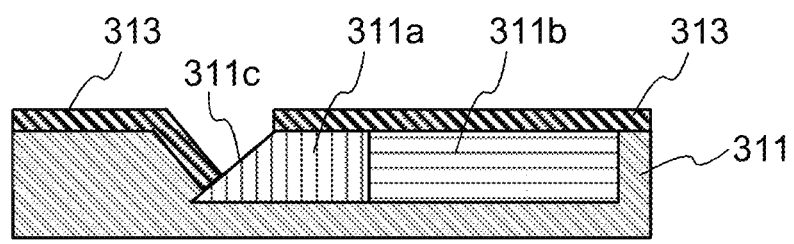
Figure 14C:
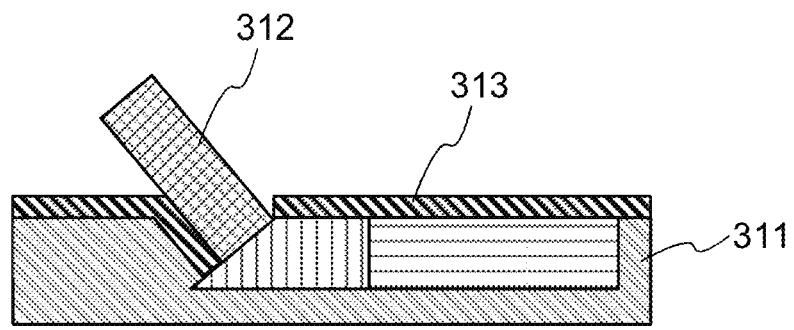
Figure 14D:
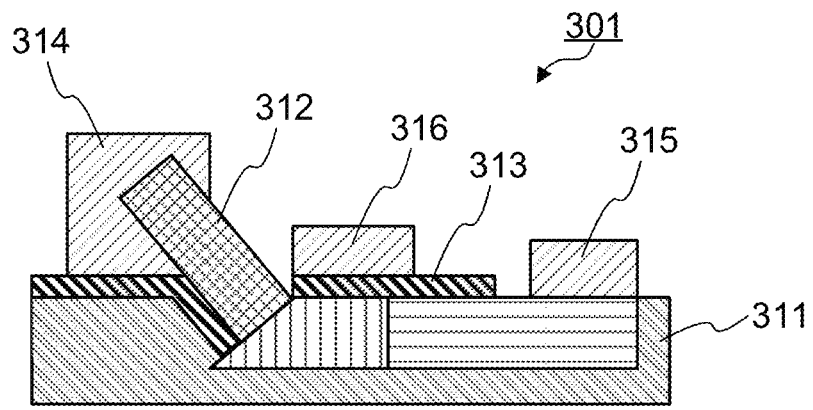

First, as illustrated in FIG. 14A, IV group semiconductor substrate 311 is prepared. In this IV group semiconductor substrate 311, undoped first region 311a, and second region 311b highly doped in the n-type are formed. Next, as illustrated in FIG. 14B, anisotropic etching is performed at first region 311a of IV group semiconductor substrate 311 to expose (111) surface 311c. In addition, insulating film 313 is formed by the heat oxidation method and the like at the surface of IV group semiconductor substrate 311. In this insulating film 313, an opening is formed such that (111) surface 311c of first region 311a of IV group semiconductor substrate 311 is exposed. Next, as illustrated in FIG. 14C, by a MOVPE method, III-V group compound semiconductor nanowire 312 is grown through the opening from (111) surface 311c of first region 311a. At this time, before III-V group compound semiconductor nanowire 312 is grown, it is preferable to form a thin film of a III-V group compound semiconductor at (111) surface 311c of first region 311a by an alternate raw material supply modulation method (see WO2011/040012). Finally, first electrode 314, second electrode 315 and gate electrode 316 are formed as illustrated in FIG. 14D.

Effect

In switch device 300 according to the present embodiment, first TFET 301 (n-TFET) and second TFET 302 (p-TFET) have substantially the same configuration. Thus, switch device 300 according to the present embodiment can be easily integrated even though it is a complementary switch device including a TFET.

Embodiment 4

Embodiment 4 describes an example of a complementary switch device according to the embodiment of the present invention in which a III-V group compound semiconductor nanowire obliquely extends from a surface of a IV group semiconductor substrate low-doped in the n-type.

Configuration of Complementary Switch Device

Figure 15:
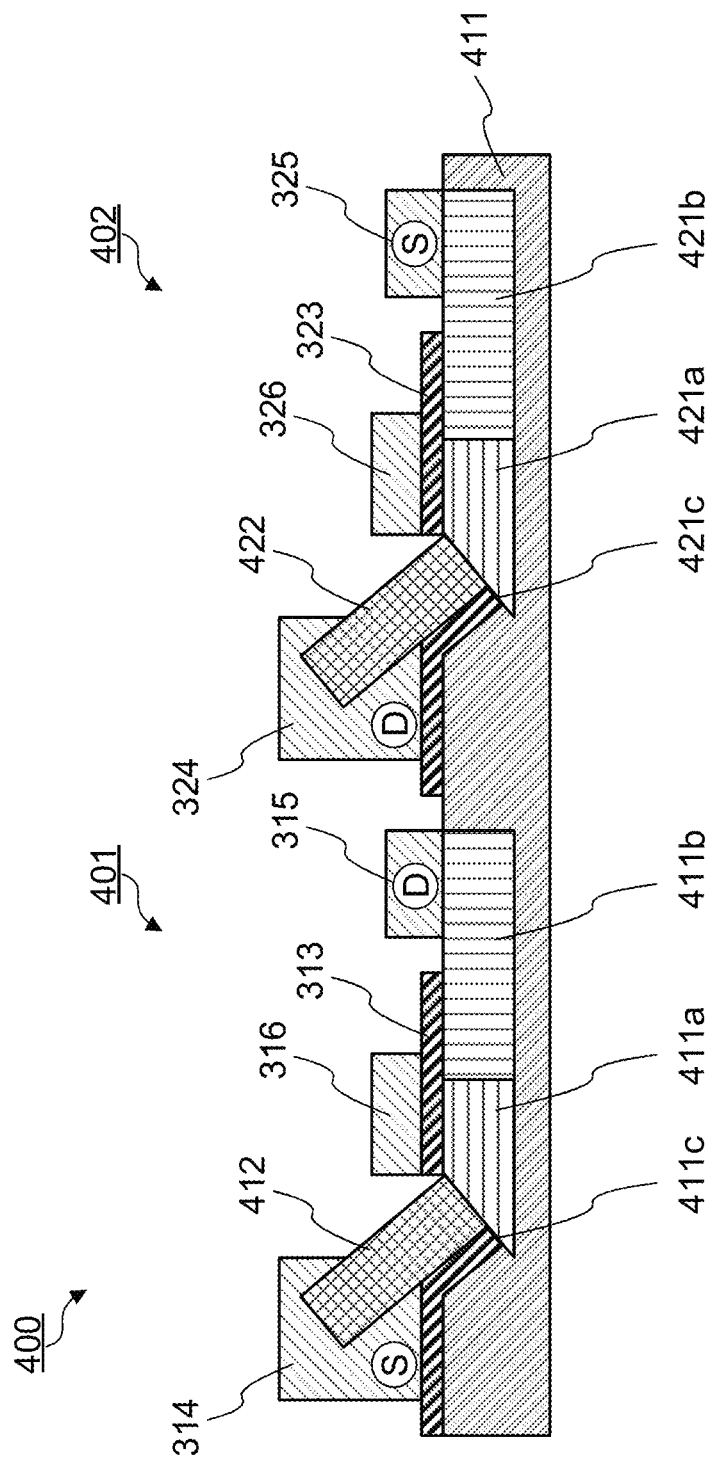
FIG. 15 is a sectional view illustrating a configuration of a complementary switch device according to Embodiment 4.

FIG. 15 is a sectional view illustrating a configuration of complementary switch device 400 according to Embodiment 4. The same components as those of the TFET of Embodiment 3 are denoted with the same reference numerals, and overlapping descriptions are omitted.

As illustrated in FIG. 15, switch device 400 of Embodiment 4 includes at least one first tunnel field-effect transistor (first TFET) 401 and at least one second tunnel field-effect transistor (second TFET) 402.

First TFET 401 is a TFET (p-TFET) including a p-type channel, and second TFET 402 is a TFET (n-TFET) including an n-type channel. First TFET 401 and second TFET 402 have substantially the same configuration, but the positional relationship between the source electrode (indicated as "S" in FIG. 15) and the drain electrode (indicated as "D" in FIG. 15) is reversed in first TFET 401 and second TFET 402.

First TFET 401 includes IV group semiconductor substrate 411, III-V group compound semiconductor nanowire 412, insulating film (gate dielectric film) 313, first electrode (source electrode) 314, second electrode (drain electrode) 315 and gate electrode 316. A partial region of insulating film 313 functions also as a gate dielectric film. IV group semiconductor substrate 411 includes undoped first region 411a, and second region 411b highly doped in the p-type. In first TFET 401, first electrode 314 is a source electrode, and second electrode 315 is a drain electrode. In first TFET 401, tunneling occurs at the junction interface between (111) surface 411c of IV group semiconductor substrate 411 and III-V group compound semiconductor nanowire 412.

Second TFET 402 includes IV group semiconductor substrate 411, III-V group compound semiconductor nanowire 422, insulating film (gate dielectric film) 323, first electrode (drain electrode) 324, second electrode (source electrode) 325 and gate electrode 326. A partial region of insulating film 323 functions also as a gate dielectric film. IV group semiconductor substrate 411 includes undoped first region 421a, and second region 421b highly doped in the p-type. In second TFET 402, first electrode 324 is a drain electrode, and second electrode 325 is a source electrode. In second TFET 402, tunneling occurs at the junction interface between (111) surface 421c of IV group semiconductor substrate 411 and III-V group compound semiconductor nanowire 422.

IV group semiconductor substrate 411 is a substrate composed of a IV group semiconductor such as silicon and germanium, and includes a (100) surface as its top surface. IV group semiconductor substrate 411 is, for example, a silicon (100) substrate. In the present embodiment, IV group semiconductor substrate 411 is low-doped in the n-type. In first TFET 401, undoped first region 411a (intrinsic semiconductor), and second region 411b highly doped in the p-type (p-type semiconductor) are formed adjacent to each other at the surface where III-V group compound semiconductor nanowire 412 is disposed, of the two surfaces of IV group semiconductor substrate 411. First region 411a includes not only the (100) surface, but also (111) surface 411c. Likewise, in second TFET 402, undoped first region 421a (intrinsic semiconductor), and second region 421b highly doped in the p-type (p-type semiconductor) are formed adjacent to each other at the surface where III-V group compound semiconductor nanowire 422 is disposed, of the two surfaces of IV group semiconductor substrate 411. First region 421a includes not only (100) surface, but also (111) surface 421c.

III-V group compound semiconductor nanowires 412 and 422 are structures composed of a III-V group compound semiconductor with a diameter of 2 to 100 nm and a length of 50 nm to 10 μm. III-V group compound semiconductor nanowires 412 and 422 are disposed on (111) surfaces 411c and 421c of IV group semiconductor substrate 411 with their longitudinal axes being perpendicular to (111) surfaces 411c and 421c. The III-V group compound semiconductor may be any of a semiconductor consisting of two elements, a semiconductor consisting of three elements, a semiconductor consisting of four elements, or a semiconductor consisting of five or more elements.

Figure 16:
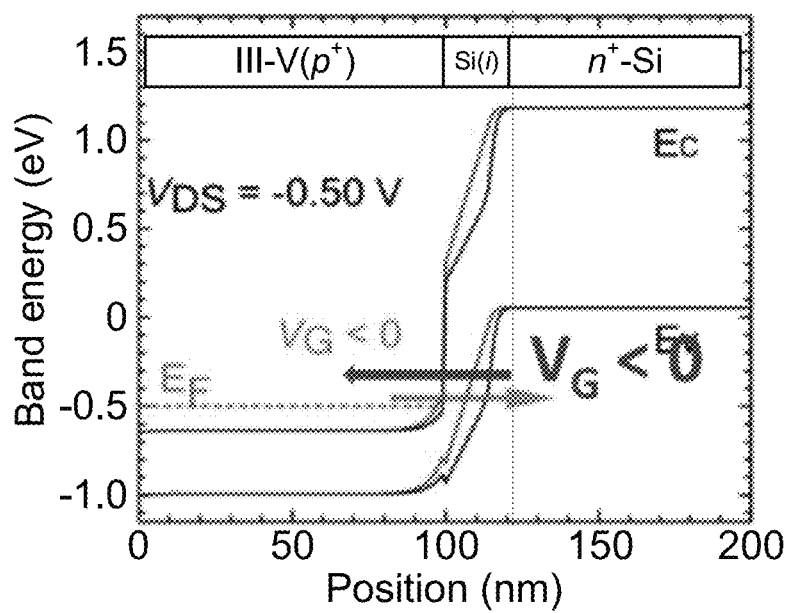
FIG. 16 is a band structure diagram of a first TFET and a second TFET of the complementary switch device according to Embodiment 4.

III-V group compound semiconductor nanowires 412 and 422 are undoped or low-doped in the n-type. In the present embodiment, III-V group compound semiconductor nanowires 412 and 422 are low-doped in the p-type. III-V group compound semiconductor nanowires 412 and 422 and (111) surfaces 411c and 421c of IV group semiconductor substrate 411 form a substantially dislocation-free and defect-free junction interface. In first TFET 401 and second TFET 402, the junction interface between (111) surfaces 411c and 421c of IV group semiconductor substrate 411 and III-V group compound semiconductor nanowires 412 and 422 functions as a tunnel layer. As described above, first TFET 401 and second TFET 402 have substantially the same configuration, but the positional relationship between the source electrode (indicated as "S" in FIG. 15) and the drain electrode (indicated as "D" in FIG. 15) is reversed in first TFET 401 and second TFET 402. The present inventor found that by only changing the position of the electrode in the above-described manner, first TFET 401 operates as a TFET (p-TFET) including a p-type channel, and second TFET 402 operates as a TFET (n-TFET) including an n-type channel as illustrated in FIG. 16. Thus, the functions as various types of complementary switch devices can be achieved by appropriately connecting one or more first TFETs 401 and one or more second TFETs 402.

Method of Manufacturing Complementary Switch Device

The method of manufacturing switch device 400 according to the present embodiment is not limited. Switch device 400 of Embodiment 4 can be produced through the same procedure as that of switch device 300 of Embodiment 3.

Effect

In switch device 400 according to the present embodiment, first TFET 401 (p-TFET) and second TFET 402 (n-TFET) have substantially the same configuration. Thus, switch device 400 according to the present embodiment can be easily integrated even though it is a complementary switch device including a TFET.

Note that in the present embodiment, the switch device includes a single-gate type TFET in which one gate electrode is disposed for one channel, but each TFET may include a multi-gate type TFET in which a plurality of gate electrodes is disposed for one channel. This application is entitled to and claims the benefit of Japanese Patent Application No. 2018-247228 filed on Dec. 28, 2018, the disclosure each of which including the specification, drawings and abstract is incorporated herein by reference in its entirety.

INDUSTRIAL APPLICABILITY

The complementary switch device of the embodiment of the present invention is useful as switch devices formed in semiconductor microprocessors and highly integrated circuits, for example.

REFERENCE SIGNS LIST 100, 200 Complementary switch device
101, 201 First tunnel field-effect transistor (First TFET)
102, 202 Second tunnel field-effect transistor (Second TFET)
111, 211 IV group semiconductor substrate
112 Insulating film
113, 123, 213, 223 III-V group compound semiconductor nanowire
113a, 123a, 213a, 223a First region
113b, 123b, 213b, 223b Second region
114, 124 Gate dielectric film
115, 125 Insulation protective film
116, 126 First electrode
117, 127 Second electrode
118, 128 Gate electrode
300, 400 Complementary switch device
301, 401 First tunnel field-effect transistor (First TFET)
302, 402 Second tunnel field-effect transistor (Second TFET)
311, 411 IV group semiconductor substrate
311a, 321a, 411a, 421a First region
311b, 321b, 411b, 421b Second region
311c, 321c, 411c, 421c (111) surface
312, 322, 412, 422 III-V group compound semiconductor nanowire
313, 323 Insulating film (Gate dielectric film)
314, 324 First electrode
315, 325 Second electrode
316, 326 Gate electrode

The invention claimed is:

1. A complementary switch device comprising:
a first tunnel field-effect transistor including a channel of a first conductivity type; and
a second tunnel field-effect transistor including a channel of a second conductivity type different from the first conductivity type,
wherein each of the first tunnel field-effect transistor and the second tunnel field-effect transistor includes:
 a IV group semiconductor substrate including a (111) surface, and doped in the first conductivity type;
 a III-V group compound semiconductor nanowire disposed on the (111) surface, and including a first region connected to the (111) surface and a second region doped in the second conductivity type;
 a first electrode connected to the IV group semiconductor substrate;
 a second electrode connected to the second region; and
 a gate electrode configured to apply an electric field to an interface between the (111) surface and the first region;
wherein the first tunnel field-effect transistor and the second tunnel field-effect transistor have the same configuration;
wherein the IV group semiconductor substrate of the first tunnel field-effect transistor and the IV group semiconductor substrate of the second tunnel field-effect transistor are both doped in the first conductivity type;
wherein in the first tunnel field-effect transistor, the second electrode is a source electrode, and the first electrode is a drain electrode;
in the second tunnel field-effect transistor, the first electrode is a source electrode, and the second electrode is a drain electrode; and
a positional relationship between the source electrode and the drain electrode is reversed in the first tunnel field-effect transistor and the second tunnel field-effect transistor.

2. The complementary switch device according to claim 1,
wherein a IV group semiconductor that constitutes the IV group semiconductor substrate is silicon or germanium;
wherein a III-V group compound semiconductor that constitutes the III-V group compound semiconductor nanowire is InAs, InP, GaAs, GaN, InSb, GaSb, AlSb, AlGaAs, InGaAs, InGaN, AlGaN, GaNAs, InAsSb, GaAsSb, InGaSb, AlInSb, InGaAlN, AlInGaP, InGaAsP, GaInAsN, InGaAlSb, InGaAsSb or AlInGaPSb; and
wherein a longitudinal axis of the III-V group compound semiconductor nanowire is perpendicular to the (111) surface.

3. The complementary switch device according to claim 1,
wherein each of the first tunnel field-effect transistor and the second tunnel field-effect transistor further includes a gate dielectric film disposed on a side surface of the III-V group compound semiconductor nanowire; and
wherein the gate electrode is disposed on the gate dielectric film.

4. A complementary switch device comprising:
a first tunnel field-effect transistor including a channel of a first conductivity type; and
a second tunnel field-effect transistor including a channel of a second conductivity type different from the first conductivity type,
wherein each of the first tunnel field-effect transistor and the second tunnel field-effect transistor includes:
 a IV group semiconductor substrate including a first region including a (111) surface, and a second region doped in the first conductivity type;
 a III-V group compound semiconductor nanowire disposed on the (111) surface, the III-V group compound semiconductor nanowire being undoped, or doped in the second conductivity type;
 a first electrode connected to the III-V group compound semiconductor nanowire;
 a second electrode connected to the second region; and
 a gate electrode configured to apply an electric field to an interface between the III-V group compound semiconductor nanowire and the (111) surface;
wherein the first tunnel field-effect transistor and the second tunnel field-effect transistor have the same configuration;
wherein the second region of the first tunnel field-effect transistor and the second region of the second tunnel field-effect transistor are both doped in the first conductivity type;

wherein in the first tunnel field-effect transistor, the first electrode is a source electrode, and the second electrode is a drain electrode;

in the second tunnel field-effect transistor, the second electrode is a source electrode, and the first electrode is a drain electrode; and a positional relationship between the source electrode and the drain electrode is reversed in the first tunnel field-effect transistor and the second tunnel field-effect transistor.

5. The complementary switch device according to claim 4, wherein a IV group semiconductor that constitutes the IV group semiconductor substrate is silicon or germanium;

wherein a III-V group compound semiconductor that constitutes the III-V group compound semiconductor nanowire is InAs, InP, GaAs, GaN, InSb, GaSb, AlSb, AlGaAs, InGaAs, InGaN, AlGaN, GaNAs, InAsSb, GaAsSb, InGaSb, AlInSb, InGaAlN, AlInGaP, InGaAsP, GaInAsN, InGaAlSb, InGaAsSb or AlInGaPSb; and wherein a longitudinal axis of the III-V group compound semiconductor nanowire is perpendicular to the (111) surface.

6. The complementary switch device according to claim 4, wherein each of the first tunnel field-effect transistor and the second tunnel field-effect transistor further includes a gate dielectric film disposed on a surface of the IV group semiconductor substrate; and wherein the gate electrode is disposed on the gate dielectric film.

* * * * *